United States Patent
Lu et al.

(10) Patent No.: US 11,510,297 B2
(45) Date of Patent: Nov. 22, 2022

(54) ADAPTIVE POWER CONTROL FOR PULSED LASER DIODES

(71) Applicant: BEIJING VOYAGER TECHNOLOGY CO., LTD., Beijing (CN)

(72) Inventors: Yue Lu, Los Gatos, CA (US); Yibo Yu, Mountain View, CA (US); Yang Yang, Mountain View, CA (US); Lingkai Kong, Palo Alto, CA (US); Youmin Wang, Berkeley, CA (US); Zuow-Zun Chen, Mountain View, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 991 days.

(21) Appl. No.: 16/231,823

(22) Filed: Dec. 24, 2018

(65) Prior Publication Data
US 2020/0205250 A1    Jun. 25, 2020

(51) Int. Cl.
*H04B 10/564* (2013.01)
*H05B 45/44* (2020.01)
(Continued)

(52) U.S. Cl.
CPC ......... *H05B 45/44* (2020.01); *H01S 5/02325* (2021.01); *H01S 5/0428* (2013.01);
(Continued)

(58) Field of Classification Search
CPC ........ H05B 45/44; H05B 45/10; H05B 45/37; H01S 5/02325; H01S 5/0428;
(Continued)

(56) References Cited

U.S. PATENT DOCUMENTS 5,920,583 A * 7/1999 Chen .................. H01S 5/02415
372/38.07
6,225,621 B1   5/2001 Rogers et al.
(Continued)

FOREIGN PATENT DOCUMENTS

CN    107863678 A    3/2018
CN    108181621 A    6/2018
(Continued)

OTHER PUBLICATIONS

International Search Report issued in corresponding International Application No. PCT/US2018/067758, dated Apr. 18, 2019, 5 pages.
(Continued)

*Primary Examiner* — Dibson J Sanchez
(74) *Attorney, Agent, or Firm* — Bayes PLLC (57) ABSTRACT

Embodiments of the disclosure provide control systems and methods for controlling a pulsed laser diode and a sensing device including a pulsed laser diode. An exemplary control system includes a distance detector configured to generate a distance signal indicating a distance between the pulsed laser diode and an object reflecting pulsed laser beams emitted by the pulsed laser diode. The control system may also include a controller configured to dynamically control power supplied to the pulse laser diode based on the distance signal.

9 Claims, 7 Drawing Sheets

(51) Int. Cl.
*H01S 5/042* (2006.01)
*H05B 45/10* (2020.01)
*H05B 45/37* (2020.01)
*H01S 5/02325* (2021.01)
*H04B 10/524* (2013.01)
*H04B 10/50* (2013.01)
*G01S 17/42* (2006.01)

(52) U.S. Cl.
CPC ........... *H04B 10/564* (2013.01); *H05B 45/10* (2020.01); *H05B 45/37* (2020.01); *G01S 17/42* (2013.01); *H04B 10/50* (2013.01); *H04B 10/524* (2013.01)

(58) Field of Classification Search
CPC .... H04B 10/564; H04B 10/50; H04B 10/524; G01S 17/42; G01S 17/931; G01S 7/484; G01S 7/4868
USPC .................................................. 398/182–201
See application file for complete search history.

(56) References Cited

U.S. PATENT DOCUMENTS

| | | | | |
|---|---|---|---|---|
| 7,545,836 | B1* | 6/2009 | Borschowa | H01S 3/2316 372/6 |
| 8,855,154 | B2* | 10/2014 | Groepl | H05B 45/397 372/38.03 |
| 2002/0122308 | A1* | 9/2002 | Ikeda | H01S 5/0427 362/259 |
| 2003/0052370 | A1* | 3/2003 | Ishii | H01S 5/042 257/368 |
| 2004/0160996 | A1* | 8/2004 | Giorgi | H01S 5/042 372/25 |
| 2005/0243879 | A1* | 11/2005 | Horiuchi | H01S 5/042 372/38.07 |
| 2009/0273770 | A1* | 11/2009 | Bauhahn | G01S 17/10 356/5.01 |
| 2011/0081945 | A1* | 4/2011 | Rothaar | H02J 1/10 455/556.1 |
| 2011/0304842 | A1* | 12/2011 | Kao | G01S 7/4918 356/5.01 |
| 2015/0226853 | A1 | 8/2015 | Seo et al. | |
| 2016/0091907 | A1* | 3/2016 | Su | G05F 1/56 323/280 |
| 2017/0356981 | A1 | 12/2017 | Yang et al. | |
| 2018/0188360 | A1* | 7/2018 | Berger | G01S 17/06 |
| 2018/0284244 | A1 | 10/2018 | Russell et al. | |
| 2019/0025406 | A1* | 1/2019 | Krelboim | H01S 5/062 |
| 2019/0064352 | A1* | 2/2019 | Chueh | G01S 17/02 |
| 2019/0154815 | A1* | 5/2019 | Oohata | G01S 17/10 |
| 2019/0229493 | A1 | 7/2019 | Stern | |
| 2020/0025896 | A1* | 1/2020 | Gunnam | G01S 17/42 |
| 2020/0043531 | A1* | 2/2020 | Earle | G11C 5/147 |
| 2020/0178361 | A1* | 6/2020 | Oka | G01S 7/4815 |

FOREIGN PATENT DOCUMENTS

| | | |
|---|---|---|
| EP | 3396413 A1 | 10/2018 |
| JP | S63-106587 A | 5/1988 |

OTHER PUBLICATIONS

Written Opinion of the International Searching Authority issued in corresponding International Application No. PCT/US2018/067758, dated Apr. 18, 2019, 5 pages.

* cited by examiner

ADAPTIVE POWER CONTROL FOR PULSED LASER DIODES

TECHNICAL FIELD

The present disclosure relates to systems and methods for controlling pulsed laser diodes, and more particularly, to systems and methods for adaptively controlling the electrical power supplied to a pulsed laser diode based on distance information.

BACKGROUND

Pulsed laser diodes (PLDs) are widely used in three-dimensional (3D) sensing applications. For example, in a light detection and ranging (LiDAR) system, PLDs are utilized to generate pulsed laser beams, which are emitted by the LiDAR and reflected by surrounding objects. The reflected laser signals may be detected by a photodetector and used to determine range or distance information based on, for example, the round-trip travel time of the laser beams.

In current systems, PLDs are powered by a constant voltage source. As a result, the output of the PLDs (e.g., laser light intensity) is fixed. Fixed light intensity has several drawbacks. For example, in 3D sensing applications, objects (e.g., detection targets) may be located at differing distances from the PLDs. For nearby objects, the PLD output may be too high, which may violate safety regulations, such as the FDA laser eye-safety standard IEC 60825-1. In addition, a high PLD output may cause the receiving photodetector to saturate, resulting in false detections. On the other hand, for distant objects, the PLD output may be too low, compromising the detection capability of the distant objects.

Embodiments of the disclosure address the above problems by adaptively controlling the PLD output based on the distance between the PLD and a detection target.

SUMMARY

Embodiments of the disclosure provide a control system for controlling a pulsed laser diode. The control system may include a distance detector configured to generate a distance signal indicating a distance between the pulsed laser diode and an object reflecting pulsed laser beams emitted by the pulsed laser diode. The control system may also include a controller configured to dynamically control power supplied to the pulse laser diode based on the distance signal.

Embodiments of the disclosure also provide a method for controlling a pulsed laser diode. The method may include generating a distance signal indicating a distance between the pulsed laser diode and an object reflecting pulsed laser beams emitted by the pulsed laser diode. The method may also include dynamically controlling power supplied to the pulse laser diode based on the distance signal.

Embodiments of the disclosure further provide a sensing device. The sensing device may include a pulsed laser diode. The sensing device may also include at least one driver coupled to the pulsed laser diode and configured to turn on the pulse laser diode to emit pulsed laser beams. The sensing device may further include a distance detector configured to generate a distance signal indicating a distance between the pulsed laser diode and an object reflecting the pulsed laser beams emitted by the pulsed laser diode. Moreover, the sensing device may include a controller configured to dynamically control power supplied to the pulse laser diode based on the distance signal.

It is to be understood that both the foregoing general description and the following detailed description are exemplary and explanatory only and are not restrictive of the invention, as claimed.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

Pulsed laser diodes (PLDs) are often used as light sources in three-dimensional (3D) sensing applications. A pulsed laser diode can be turned on for a short period of time, usually in the order of a few nanoseconds, to emit a pulsed laser light beam, which travels along a substantially straight line until being reflected by an object. The reflected light beam can be detected by a photodetector. The distance between the light source (pulsed laser diode) and the object reflecting the light beam can be determined based on the round-trip travel time of the light beam (or the phase shift between emitting and reflecting light beam signals), as the speed of light is constant. Because the angle of light emission is known, the spatial location of the object, or more precisely, the location of the reflection point on the object, can be determined. By emitting a large number of pulsed laser light beams to the surrounding environment, a "point cloud" representing a 3D distribution of the reflection points can be constructed, from which a profile of an object, the spatial location of the object, or other spatial information can be determined.

The intensity of the pulsed laser light beams (also referred to as "pulsed laser beams") emitted by a pulsed laser diode depends on the electrical power consumed by the pulsed laser diode during the turn-on period, which in turn depends on the electrical current flowing through the pulsed laser diode during the turn-on period. As discussed above, current systems for controlling pulsed laser diodes use a fixed power supply to provide a constant current to the pulsed laser diode, resulting a fixed light intensity which cannot provide satisfactory detection performance for objects located either nearby or distant. Embodiments of the present disclosure provide systems and methods to dynamically and adaptively adjusting the power consumed by or current flowing through a pulsed laser diode based on the distance between the pulsed laser diode and a target object, thereby maintaining an optimal level of light intensity adaptive to the target object under detection.

In the following description, exemplary embodiments are disclosed in the context of a vehicle-mounted LiDAR application, in which a sensing device such as a LiDAR mounted to a vehicle is operable to detect point clouds of the surround environment. It is contemplated that systems and methods for controlling the power/current of a pulsed laser diode disclosed herein are not limited to this particular application. Rather, the disclosed systems and methods are applicable to any 3D sensing applications, such as flash 3D sensing, structured light sensing, or any application using pulsed laser diodes for object sensing.

Figure 1:
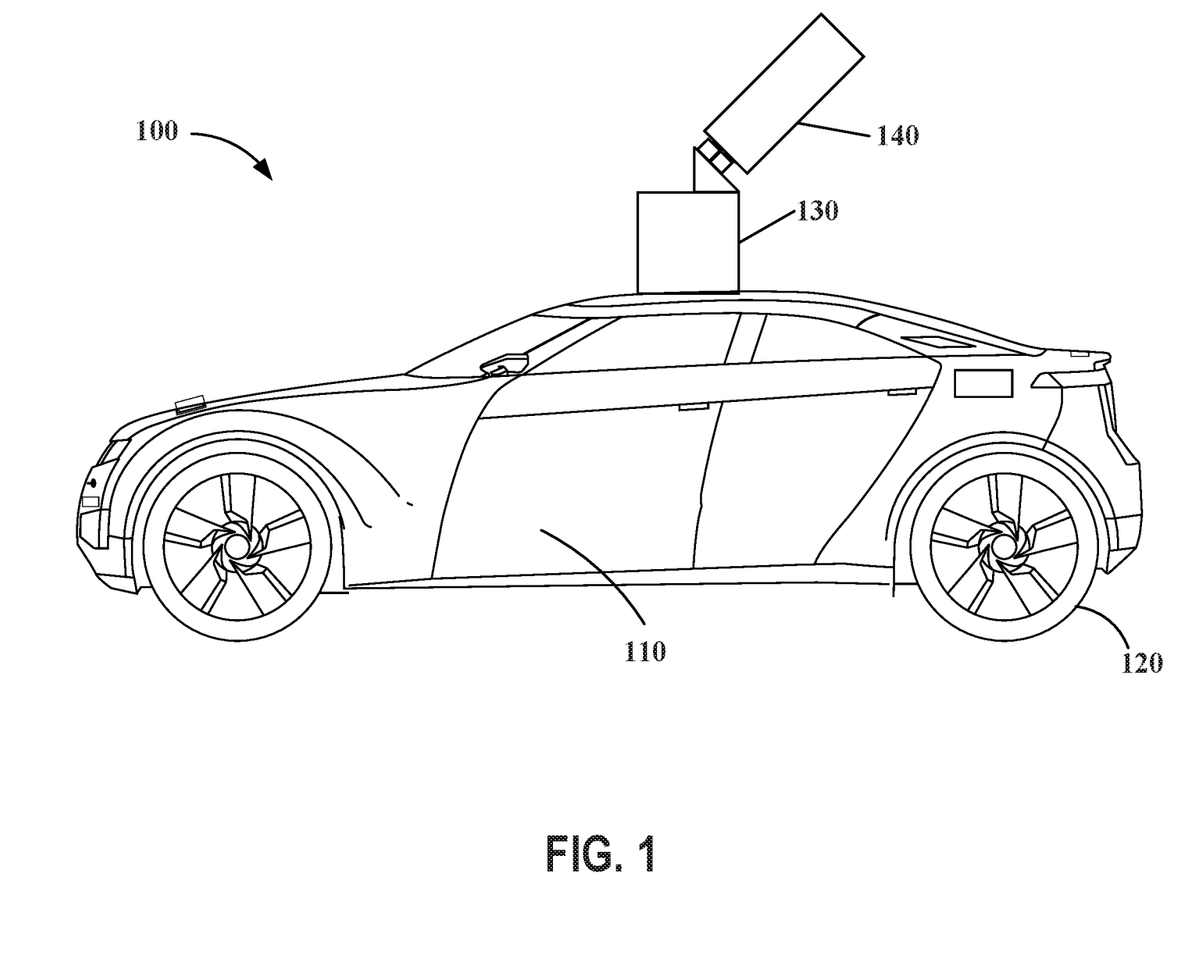
FIG. 1 illustrates a schematic diagram of an exemplary vehicle equipped with a sensing device, according to embodiments of the disclosure.

FIG. 1 illustrates a schematic diagram of an exemplary vehicle 100 equipped with a sensing device 140, according to embodiments of the disclosure. Consistent with some embodiments, vehicle 100 may be a survey vehicle configured to acquire data for constructing a high-resolution map or three-dimensional (3-D) city model. In some embodiments, vehicle 100 may be an autonomous driving vehicle using sensing device 140 to sense surrounding environment, road conditions, traffic conditions, pedestrian presence, or other information related to autonomous driving and/or navigation. It is contemplated that vehicle 100 may be an electric vehicle, a fuel cell vehicle, a hybrid vehicle, or a conventional internal combustion engine vehicle. Vehicle 100 may have a body 110 and at least one wheel 120. Body 110 may be of any body style, such as a sports vehicle, a coupe, a sedan, a pick-up truck, a station wagon, a sports utility vehicle (SUV), a minivan, or a conversion van. In some embodiments, vehicle 100 may include a pair of front wheels and a pair of rear wheels, as illustrated in FIG. 1. However, it is contemplated that vehicle 100 may have less wheels or equivalent structures that enable vehicle 100 to move around. Vehicle 100 may be configured to be all wheel drive (AWD), front wheel drive (FWR), or rear wheel drive (RWD). In some embodiments, vehicle 100 may be configured to be operated by an operator occupying the vehicle, remotely controlled, and/or autonomous.

As illustrated in FIG. 1, vehicle 100 may be equipped with sensing device 140 mounted to body 110 via a mounting structure 130. Mounting structure 130 may be an electro-mechanical device installed or otherwise attached to body 110 of vehicle 100. In some embodiments, mounting structure 130 may use screws, adhesives, or another mounting mechanism. It is contemplated that the manners in which sensing device 140 can be equipped on vehicle 100 are not limited by the example shown in FIG. 1. The equipping manners may be modified depending on the type of sensing device 140 and/or vehicle 100 to achieve desirable sensing performance.

In some embodiments, sensing device 140 may be configured to capture data as vehicle 100 moves along a trajectory. In some embodiments, sensing device 140 may be a LiDAR scanner/device configured to scan the surrounding and acquire point clouds. LiDAR measures distance to a target object by illuminating the target object with pulsed laser beams and measuring the reflected pulses with a photodetector. Differences in laser return s, phases, or wavelengths can then be used to make digital 3-D representations of the target object, including distance information (also referred to as "range information"). The light used for LiDAR scan may be ultraviolet, visible, or near infrared. In some embodiments, sensing device 140 may capture a point cloud. As vehicle 100 moves along the trajectory, sensing device 140 may acquire a series of point clouds at multiple time points, which may be used to construct a high definition map or facilitate autonomous driving.

FIGS. 2-5 illustrate several circuit diagrams of exemplary control systems for controlling a pulsed laser diode 202, according to some disclosed embodiments. Components shown in FIGS. 2-5 may be integrated into sensing device 140 or may be distributed among several devices that coupled to each other through direct links or one or more networks.

Figure 2:
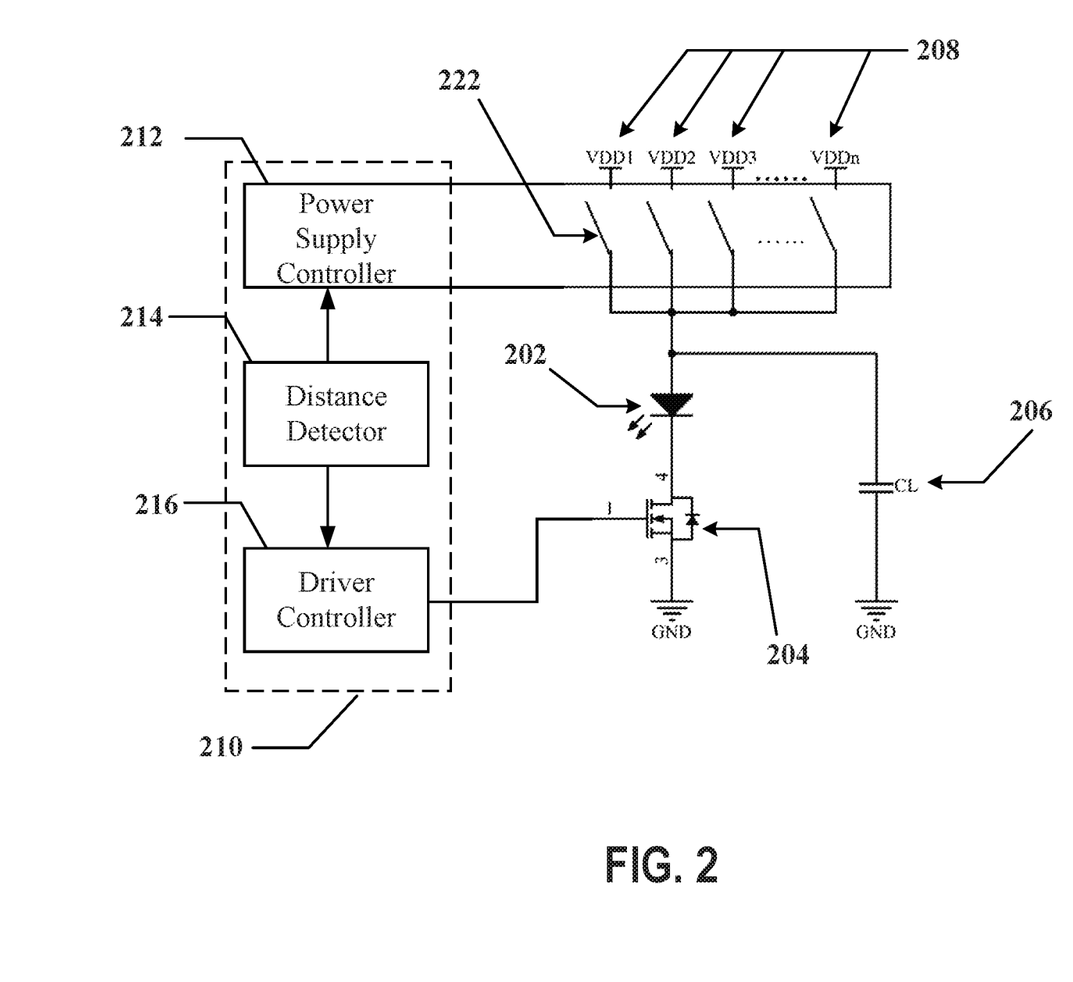
FIGS. 2-5 illustrate circuit diagrams of several exemplary control systems for controlling a pulsed laser diode based on distance signals, according to embodiments of the disclosure.

As shown in FIG. 2, pulse laser diode 202 may be connected to a capacitor 206 on one end (e.g., anode), and connected to a driver 204 on the other end (e.g., cathode). Capacitor 206 may be configured to store electrical charges provided by a power source 208. In the embodiment shown in FIG. 2, power source 208 includes an array of individual power supplies VDD1, VDD2, . . . , VDDn. Each individual power supply is coupled to capacitor 206 through a switch in a switch array 222. Switch array 222 can be controlled by a power supply controller 212. For example, power supply controller 212 can close (e.g., turn on) one or more individual switches in switch array 222 to allow charging of capacitor 206 by one or more corresponding power supplies. In some embodiments, power supplies of power source 208 may have different power outputs. For example, as shown in FIG. 2, power supplies VDD1, VDD2, . . . , VDDn may be voltage power sources that have different output voltage values. In this case, power supply controller 212 may close any one of the switches in switch array 222 to charge capacitor 206 to different voltage levels, resulting in different amounts of electrical charges being temporarily stored in capacitor 206.

Driver 204 may be configured to turn on and off pulsed laser diode 202 in short periods of time to produce pulsed laser beams. Driver 204 may be implemented using any suitable switching devices such as field-effect transistors (FETs) (e.g., metal-oxide-semiconductor field-effect transistors (MOSFETs), junction gate field-effect transistors (JFETs), etc.), bipolar junction transistors (BJTs), insulated-gate bipolar transistors (IGBTs), or the like. Driver 204 is controlled by a driver controller 216, which may apply a driving signal (e.g., a voltage signal) to a controlling junction (e.g., gate 1) of driver 204 to turn on driver 204, thereby closing a discharge loop from capacitor 206 through pulsed laser diode 202 to driver 204. Electrical charges temporarily stored in capacitor 206 may be discharged along the loop, creating electrical current that flowing through pulsed laser diode 202. Pulsed laser diode 202 converts the electrical energy to photo energy and emit a laser light beam, the intensity of which depends on the level of electrical current flowing through pulsed laser diode 202.

Specifically, the electrical current flowing through pulsed laser diode 202 during the turn-on period (e.g., a short pulse) can be represented as follows:

$$I = \frac{CL \cdot V}{Tp}. \tag{1}$$

In equation (1), I is the electrical current flowing through pulsed laser diode 202, CL is the capacitance of capacitor 206, V is the voltage level of power source 208 (e.g., selected from VDD1, VDD2, . . . , VDDn), and Tp is the pulse width or pulse period, normally in the order of a few nanosecond. The time period between two consecutive pulses can be set according to requirement of specific applications, considering the charging time of charging capacitor 206, transient time of turning on/off or switching among individual power supplies of power source 208, or other factors. For example, two consecutive pulses can be set to be one to a few microseconds apart.

The output power of pulsed laser diode 202 (e.g., proportional to the intensity of the emitted laser light beam) is proportional to current I. From equation (1), current I can be controlled by adjusting CL, V, and/or Tp.

Embodiments of the present disclosure provide systems and methods to dynamically adjust one or more of these parameters (e.g., CL, V, and/or Tp) during the time period between pulses (e.g., in the order of microseconds) based on distance information indicating a distance between pulsed laser diode 202 and a target object, thereby adaptively controlling the output intensity of the pulsed laser beams to accommodate different distances.

As shown in FIG. 2, distance information can be provided by a distance detector 214, which may be configured to generate a distance signal indicating a distance between the pulsed laser diode and an object reflecting pulsed laser beams emitted by pulsed laser diode 202. For example, distance detector 214 may measure the time difference between emitted pulse and reflected pulse (e.g., a round-trip time of a pulsed laser beam), and determined the distance based on the round-trip time and the speed of light. In another example, distance detector 214 may use distance/range information obtained from previous pulse(s) or by other pulsed laser diode(s) to estimate the distance information (e.g., using weighted averaging, linear or nonlinear interpolation, prediction based on a learning model, etc.). In a further example, distance detector 214 may determine distance information using information of a camera, such as a depth map derived from a 2D image captured by a 2D camera or range information obtained by a 2D camera. In yet a further example, distance detector 214 may determine distance information based on ultrasonic sensing (e.g., using reflected ultrasound waves to calculate distance information), radar sensing (e.g., using reflected radar waves to calculate distance information), or any other suitable distance detection methods.

After determining the distance information, distance detector 214 may generate a distance signal indicating the distance between the pulsed laser diode and a target object. In some embodiments, the distance signal can be the actual distance value (e.g., in meters, yards, or any suitable distance units). In some embodiments, the distance signal may be in a form of a control signal to, for example, instruct power supply controller 212 to switch to a higher or lower voltage supply. For example, distance detector may preprocess the determined distance information, such as comparing to distance to one or more predetermined threshold values or determine if the distance falls within one or more predetermined ranges. Then, distance detector may output distance signals indicating that the distance is above/below a certain threshold or within a certain range. Based on such distance signals, power supply controller 212 may determine which power supply to switch on, and switch on a certain power supply in power source 208 based on the determination. For instance, if distance detector 214 determines that the distance is 20 meters. Based on the value of 20 meters, distance detector 214 may output a distance signal indicating that the distance falls with a range of 18-25 meters. Power supply controller 212 may determine to use VDD2 to charge capacitor 206 to best accommodate the distance range (e.g., considering the signal-to-noise ratio, eye safety requirements, photodetector saturation level, etc.). Power supply controller 212 may then switch on VDD2 during the time period between a last pulse and the next pulse to charge capacitor 206 to VDD2. In some embodiment, power supply controller 212 may switch off the power supply used for charging capacitor 206 after capacitor 206 is sufficiently charged. In other embodiments, the power supply used for charging capacitor 206 may be kept on until the next pulse is emitted.

Power supply controller may be configured to dynamically switch from one power supply to another power supply based on the distance signal. For example, when the distance signal indicates that the distance between pulsed laser diode 202 and a target object is shorter than a first threshold, power supply controller 212 may control switch array 222 to switch from a higher-level power supply (e.g., VDD3) to a lower-level power supply (e.g., VDD2) to reduce the intensity of the next light pulse to be emitted by pulsed laser diode 202. In some embodiments, power supply controller 212 may control switch array 222 to first turn off the switch corresponding to the higher-level power supply to allow capacitor 206 to discharge to below the voltage level of the lower-level power supply, then turn on the switch corresponding to the lower-level power supply to connect the lower-level power supply to capacitor 206.

In another example, when the distance signal indicates that the distance between pulsed laser diode 202 and a target object is longer than a first threshold, power supply controller 212 may control switch array 222 to switch from a lower-level power supply (e.g., VDD2) to a higher-level power supply (e.g., VDD3) to increase the intensity of the next light pulse to be emitted by pulsed laser diode 202. In some embodiments, power supply controller 212 may control switch array 222 to turn on the switch corresponding to the higher-level power supply to connect the higher-level power supply to capacitor 206 either before or after turning off the switch corresponding to the lower-level power supply. In some embodiments, the time constant of the charging circuit may be set to be sufficiently small so that capacitor 206 can be charged to the desired higher voltage level within a desired time period (e.g., before driver 204 turns on pulsed laser diode 202 to emit the next pulse).

In some embodiments, the light intensity of emitted pulsed laser beams may also be controlled by driver controller 216. For example, the current flowing through pulsed laser diode 202 also depend on the control voltage (e.g., the voltage bias between gate 1 and ground 3) of driver 204. Driver controller 216 may dynamically adjust the output voltage applied to gate 1, thereby changing the control voltage of driver 204, which in turn changes the current flowing through pulsed laser diode 204. Similar to the control logics furnished to power supply controller 212, driver controller 216 may also be configured to receive the distance signal generated by distance detector 214, and dynamically adjust the output voltage based on the distance signal.

As shown in FIG. 2, any individual controller 212, 216, or any combination of power supply controller 212, distance detector 214, and/or driver controller 216 may be individually or collectively referred to as a controller 210 for controlling the pulsed laser diode 202. Although controller 210 is shown to include 212, 214, and 216 in FIG. 2, controller 210 is not limited to this particular configuration. For example, controller 210 may be a combination of 212 and 214, a combination of 216 and 214, a combination of 212 and 216, or any individual controller/detector 212/214/216. In some embodiments, controller 210 may also include one or more of switch array 222, power source 208, capacitor 206, or driver 204.

Figure 3:
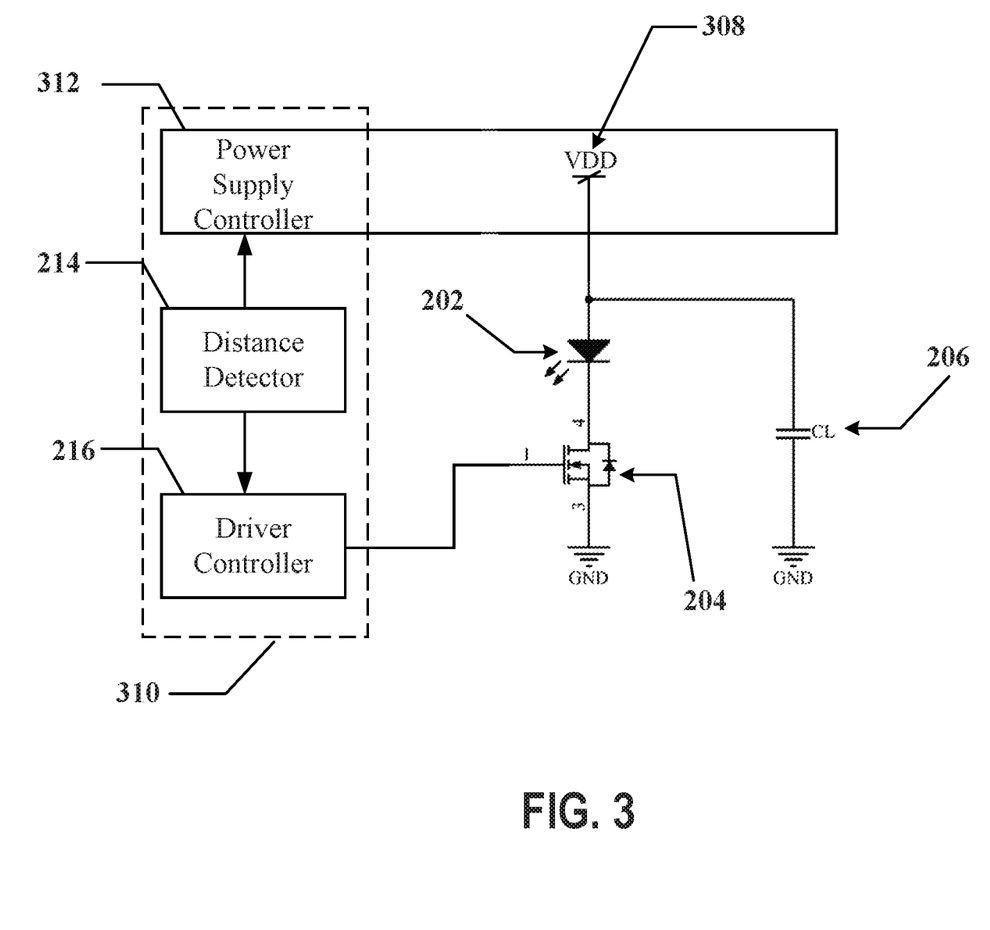

FIG. 3 illustrates another exemplary circuit diagram showing a controller 310 configured to control pulsed laser diode 202. One difference between the control systems shown in FIGS. 2 and 3 is that FIG. 3 shows a variable power supply 308 instead of a power supply array as shown in FIG. 2. Referring to FIG. 3, power supply 308 may provide different power outputs under the control of power supply controller 312. Similar to power supply controller 212, power supply controller 312 may receive a distance signal from distance detector 214, and control variable power source to output different power levels based on the distance signal. Comparing to the implementation shown in FIG. 2, the control system shown in FIG. 3 does not require multiple power supplies, and may provide the flexibility of providing more available output power levels (e.g., not limited by the fixed number of power levels determined by the number of individual power supplies in the array). On the other hand, variable power source 308 may be relatively complex to build, or may be more expensive than the array of simple, fixed-power level power supplies.

Figure 4:
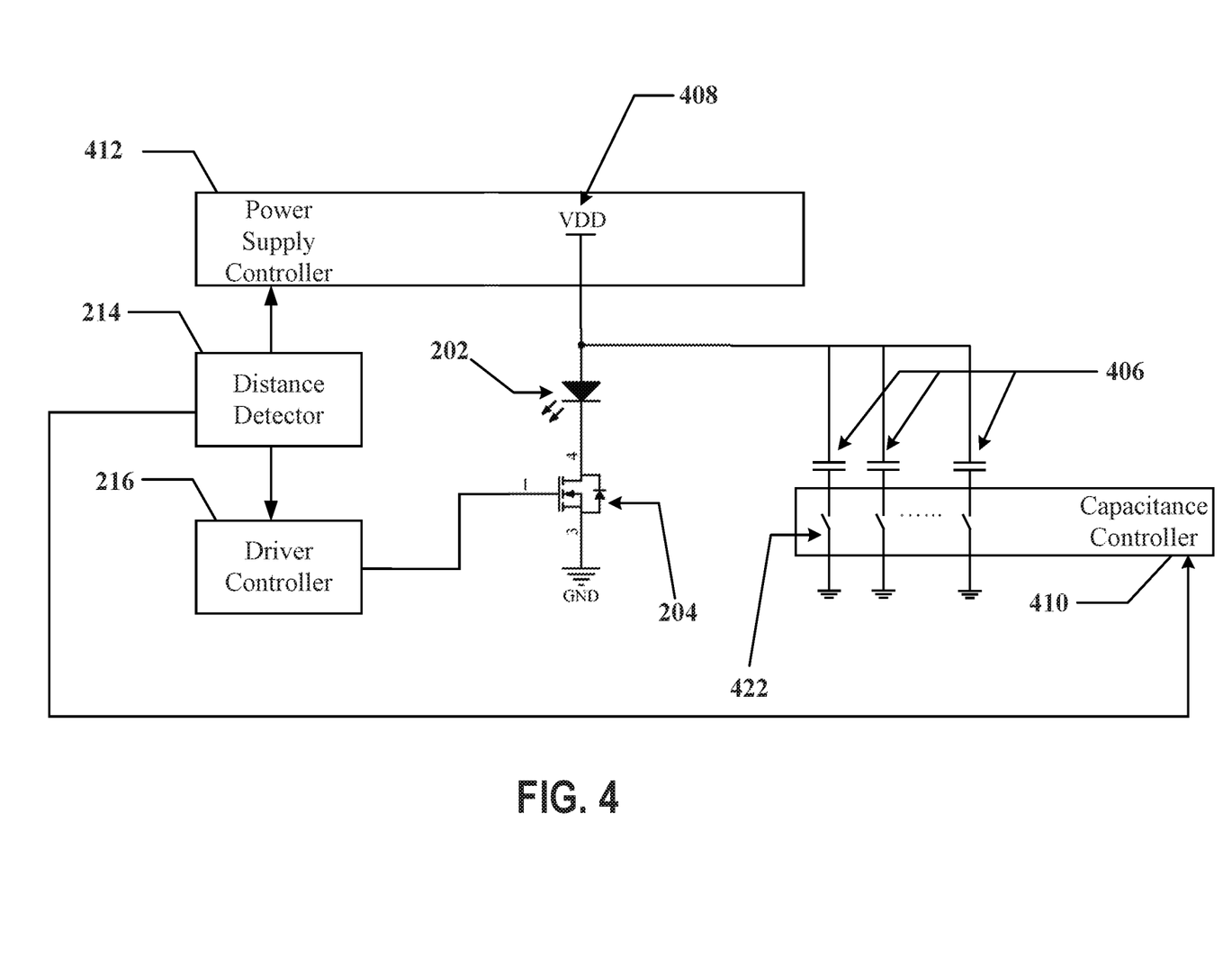

FIG. 4 illustrate a further circuit diagram in which a capacitance controller 410 is used to control the capacitance of the discharge loop. According to equation (1), controlling the capacitance CL can also control the current flowing through pulsed laser diode 202, thereby controlling the intensity of the pulsed laser beams emitted by pulsed laser diode 202. As shown in FIG. 4, instead of controlling the power source (in FIG. 4 a fixed power source 408 controlled by a power supply controller 412 is provided but it is noted that power source 208 or 308 may also be used), an array of capacitors 406 is provided in parallel to replace capacitor 206 shown in FIGS. 2 and 3. Each individual capacitor in capacitor array 406 is connected to a switch of a capacitor switch array 422, which is controlled by capacitance controller 410. Similar to control methods disclosed above in connection with power supply controller 212/312, capacitance controller 410 may receive distance signal from distance detector 214 and turn on one or more switches of capacitor switch array 422 based on the distance signal. For example, when the distance signal indicates that a longer distance is detected, capacitance controller 410 may control capacitor switch array to turn off a switch corresponding to a capacitor having a lower capacitance and turn on another switch corresponding to a capacitor having a higher capacitance, thereby increase the load capacitance of the discharge loop (e.g., increasing CL in equation (1)). Capacitance controller 410 may also switch from a higher-capacitance capacitor to a lower-capacitance capacitor when the distance signal indicates a shorter distance in a similar manner.

Because capacitors of capacitor array 406 are arranged in parallel, a higher capacitance can also be obtained by connecting multiple individual capacitors together. For example, capacitance controller 410 may turn on additional switch(es) to connect more individual capacitors into the discharge loop to increase the capacitance, in addition to or as an alternative to switching from one individual capacitor to another individual capacitor. In this case, multiple capacitors may have the same capacitance, instead of different capacitance. In other words, by controlling the quantity of capacitors connected to the pulse laser diode 202, the capacitance of the discharge loop can be dynamically changed to provide varying electrical current flowing through pulsed laser diode 202, thereby controlling the light intensity adaptively based on the distance information.

Figure 5:
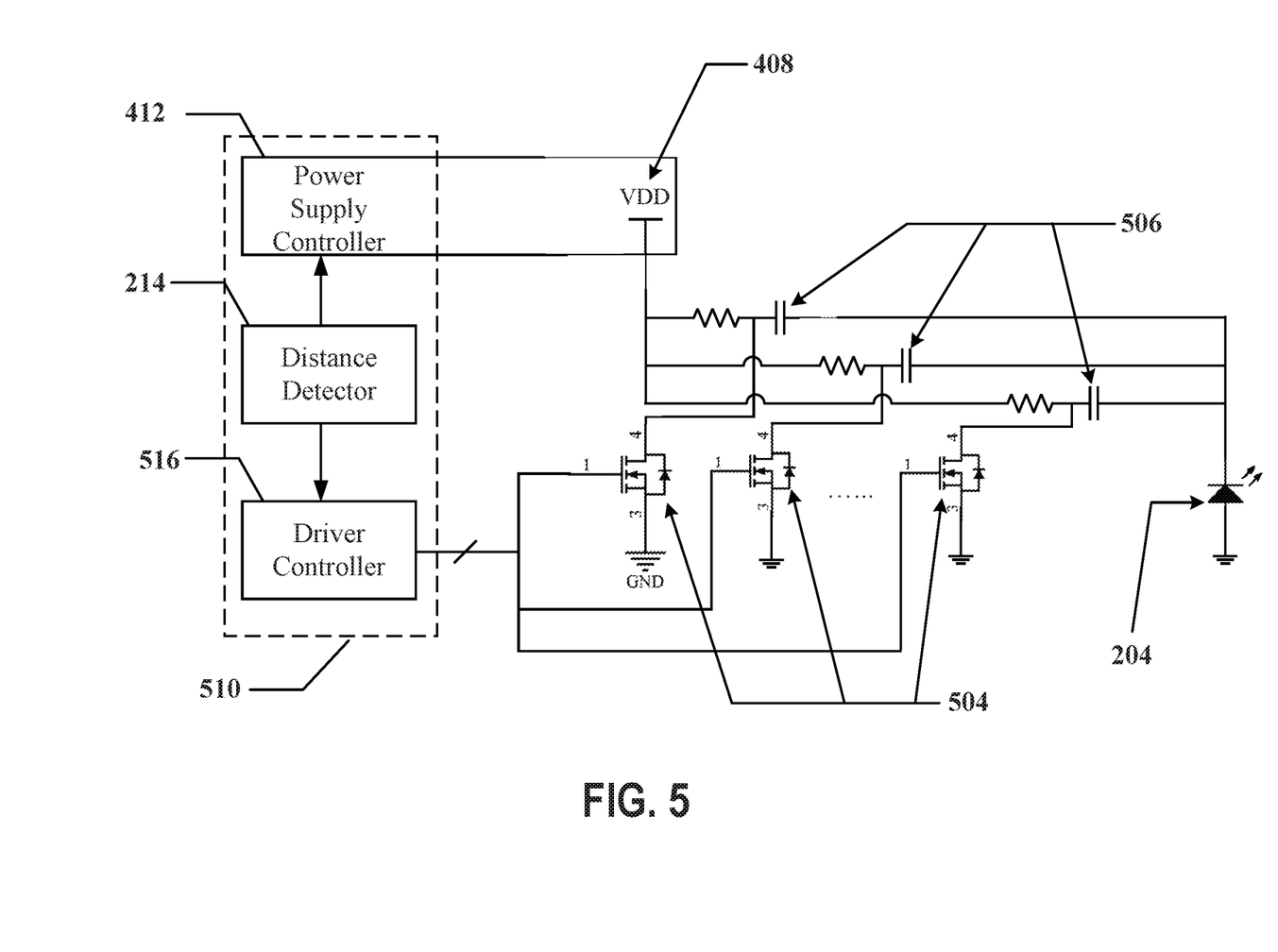

FIG. 5 shows yet another circuit diagram in which an array of drivers 504 is provided. Each driver, together with other components such as a capacitor in a capacitor array 506 form a separate route of the discharge loop. In other words, current may flow through pulsed laser diode 204 via one or more routes, each controlled by a driver within driver array 504. A driver controller 516 may control driver array 504 to switch on one or more drivers at the same time to control the amount of current flowing through pulsed laser diode 204 based on the distance signal generated by distance detector 214, similar to the control methods described above in connection with power supply controller 212/312, or capacitance controller 410. For example, when the distance signal indicates a longer distance, driver controller 516 may switch on more drivers in driver array 504 to produce a higher current flowing through pulsed laser diode 202. On the other hand, when the distance signal indicates a shorter distance, driver controller 516 may switch on fewer drivers in driver array 504 to produce a lower current flowing through pulsed laser diode 202.

Similar to controller 210, controller 510 may include any individual components such as driver controller 516, or any combination of 412, 214, and/or 516. In addition, controllers and detectors disclosed in FIGS. 2-5 may form any combination, and any individual controller/detector or any combination thereof can be referred to as a controller.

Figure 6:
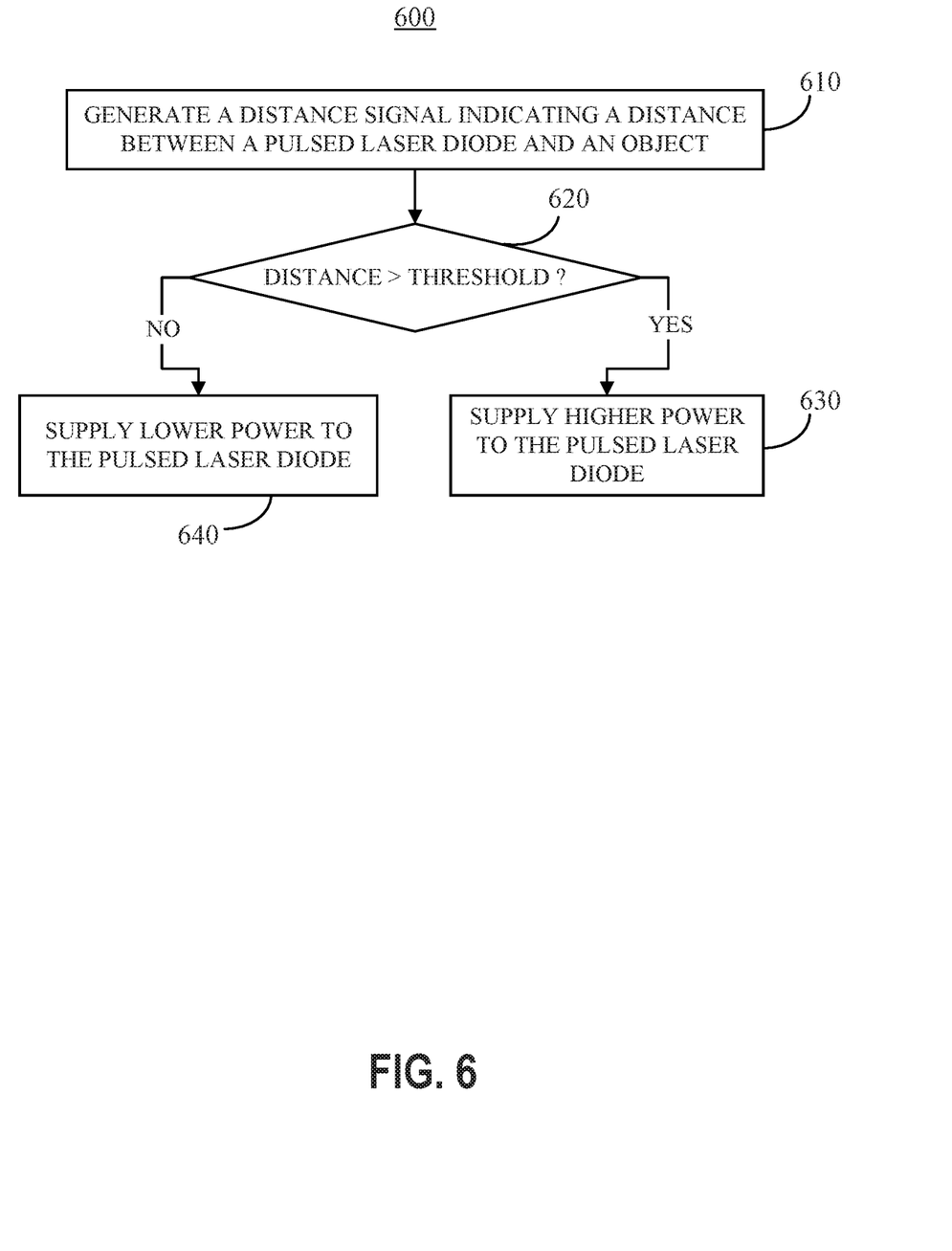
FIG. 6 illustrates a flowchart of an exemplary method for controlling a pulsed laser diode based on distance signals, according to embodiments of the disclosure.

FIG. 6 illustrates a flowchart of an exemplary method 600 for controlling a pulsed laser diode (e.g., 202), according to embodiments of the disclosure. Method 600 may be performed by any controller disclosed herein. Method 600 may include steps 610-640 as described below. It is to be appreciated that some of the steps may be optional to perform the disclosure provided herein. Further, some of the steps may be performed simultaneously, or in a different order than shown in FIG. 6.

In step 610, a distance detector, such as distance detector 214, may generate a distance signal indicating a distance between pulsed laser diode 202 and a target object subject to detection. For example, distance detector 214 may detect the distance based on reflected light, camera information, ultrasound signals, etc., as described above. Distance detector 214 may generate the actual distance information, or may process the distance information using, for example, thresholding technique to provide secondary information indicating that the distance is, for example, within a certain predetermined range.

In step 620, a controller (e.g., 212, 216, 312, 410, 516, etc.) may determine if the distance indicated by the distance signal is greater than a threshold. If so, method 600 proceeds to step 630, in which the controller may supply a higher power to the pulsed laser diode 202. On the other hand, if the distance is not greater than the threshold, then method 600 proceeds to step 640, in which the controller may supply a lower power to the pulsed laser diode 202.

Figure 7:
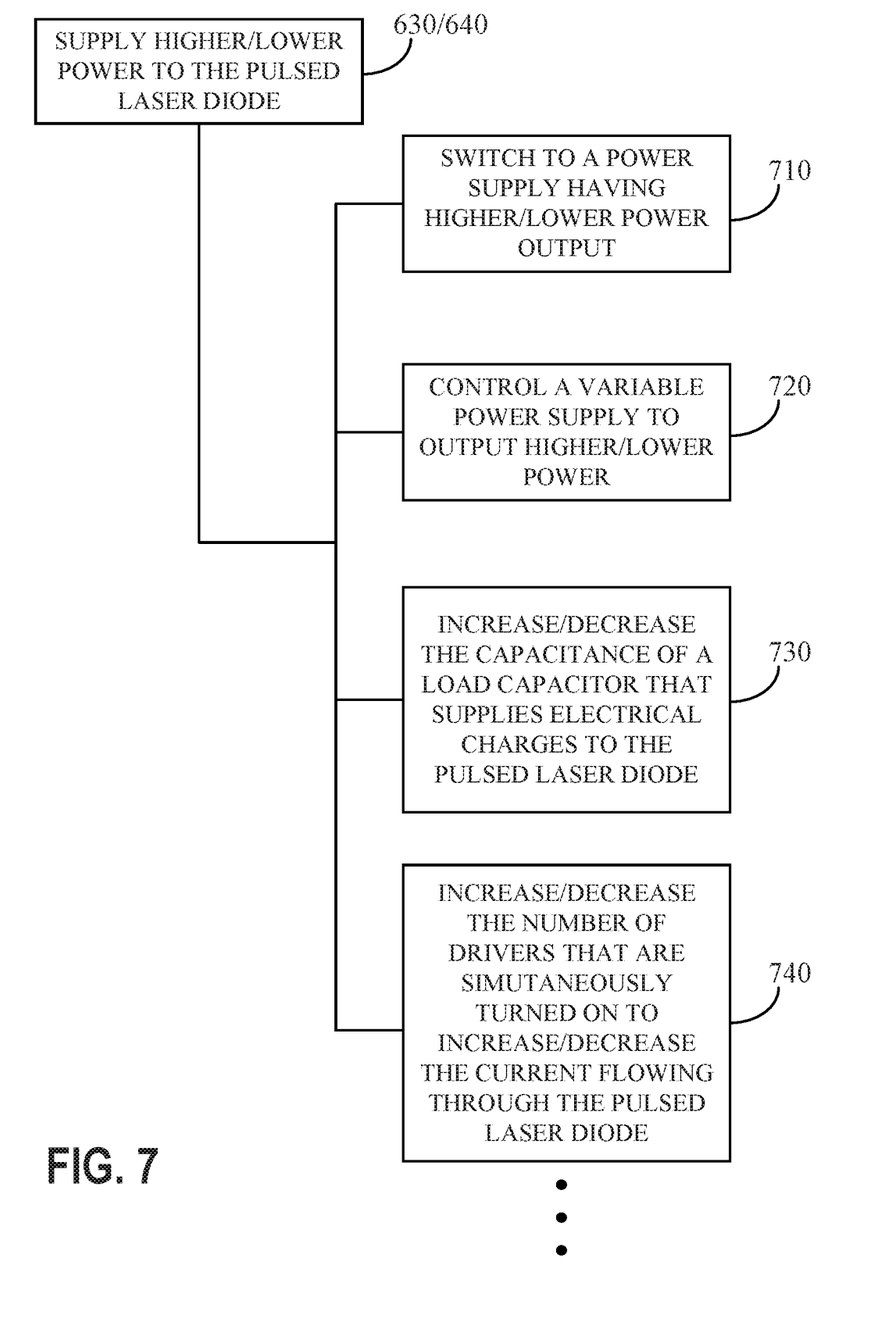
FIG. 7 illustrates exemplary methods of implementing certain steps shown in FIG. 6.

FIG. 7 illustrates exemplary methods of implementing steps 640 and 650. As shown in FIG. 7, supplying higher or lower power to the pulsed laser diode 202 may be achieved by many different methods. For example, controller 212 may switch to a power supply having a higher or lower power out (block 710) based on the distance signal, as described above in connection with FIG. 2. In another example, the controller 312 may control a variable power supply 308 to output higher or lower power (block 720), as describe above in connection with FIG. 3. In a further example, controller 410 may increase or decrease the capacitance of a load capacitor (block 730) by switching to any individual capacitor in a capacitor array, or by connecting more or fewer capacitors into the discharge loop, as described above in connection with FIG. 4. In yet another example, controller 516 may increase or decrease the number of drivers that are simultaneously turned on to increase or decrease the current flowing through the pulsed laser diode 202 (block 740), as described above in connection with FIG. 5. Other suitable methods may also be used. Any of the methods shown in FIG. 7 can be further combined depending on requirements of specific applications.

Another aspect of the disclosure is directed to a sensing device that includes a pulsed laser diode (e.g., 202) and one or more components of the control system disclosed herein. For example, the sensing device may include pulsed laser diode 202, distance detector 214, and any one of any combination of the various controllers disclosed herein.

A further aspect of the disclosure is directed to a non-transitory computer-readable medium storing instructions which, when executed, cause one or more processors to perform the methods, as discussed above. The computer-readable medium may be volatile or non-volatile, magnetic, semiconductor-based, tape-based, optical, removable, non-removable, or other types of computer-readable medium or computer-readable storage devices. For example, the computer-readable medium may be the storage device or the memory module having the computer instructions stored thereon, as disclosed. In some embodiments, the computer-readable medium may be a disc or a flash drive having the computer instructions stored thereon.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

What is claimed is:

1. A control system for controlling a pulsed laser diode, comprising:
    a plurality of power supplies having different power outputs, wherein each of the plurality of power supplies is coupled to a capacitor through a corresponding switch in a switch array, the capacitor being coupled to the pulsed laser diode;
    a distance detector configured to generate a distance signal indicating a distance between the pulsed laser diode and an object reflecting pulsed laser beams emitted by the pulsed laser diode;
    a power supply controller configured to control the switch array to connect one of the plurality of power supplies to the capacitor to charge the capacitor based on the distance signal; and
    a driver controller configured to control a driver coupled to the pulsed laser diode to discharge the capacitor through the pulsed laser diode.

2. The control system of claim 1, wherein the power supply controller is configured to dynamically control the switch array to switch from a first power supply of the plurality of power supplies to a second power supply of the plurality of power supplies based on the distance signal.

3. The control system of claim 2, wherein:
    the first power supply has a higher power output than the second power supply; and
    the power supply controller is configured to:
        switch from the first power supply to the second power supply when the distance signal indicates that the distance is shorter than a first threshold; or
        switch from the second power supply to the first power supply when the distance signal indicates that the distance is longer than a second threshold.

4. A method of controlling a pulsed laser diode, comprising:
    providing a plurality of power supplies having different power outputs, wherein each of the plurality of power supplies is coupled to a capacitor through a corresponding switch in a switch array, the capacitor being coupled to the pulsed laser diode;
    generating a distance signal indicating a distance between the pulsed laser diode and an object reflecting pulsed laser beams emitted by the pulsed laser diode;
    controlling the switch array to connect one of the plurality of power supplies to the capacitor to charge the capacitor based on the distance signal; and
    controlling a driver coupled to the pulsed laser diode to discharge the capacitor through the pulsed laser diode.

5. The method of claim 4, comprising:
    dynamically controlling the switch array to switch from a first power supply of the plurality of power supplies to a second power supply of the plurality of power supplies based on the distance signal.

6. The method of claim 5, wherein:
    the first power supply has a higher power output than the second power supply; and
    the method comprises:
        switching from the first power supply to the second power supply when the distance signal indicates that the distance is shorter than a first threshold; or
        switching from the second power supply to the first power supply when the distance signal indicates that the distance is longer than a second threshold.

7. A sensing device, comprising:
    a pulsed laser diode;
    a capacitor coupled to the pulsed laser diode;
    at least one driver coupled to the pulsed laser diode and configured to turn on the pulse laser diode by discharging the capacitor through the pulsed laser diode to emit pulsed laser beams;
    a plurality of power supplies having different power outputs, wherein each of the plurality of power supplies is coupled to the capacitor through a corresponding switch in a switch array;
    a distance detector configured to generate a distance signal indicating a distance between the pulsed laser diode and an object reflecting the pulsed laser beams emitted by the pulsed laser diode;
    a power supply controller configured to control the switch array to connect one of the plurality of power supplies to the capacitor to charge the capacitor based on the distance signal; and
    a driver controller configured to control the at least one driver to discharge the capacitor through the pulsed laser diode.

8. The sensing device of claim 7, wherein the power supply controller is configured to:
    dynamically control the switch array to switch from a first power supply of the plurality of power supplies to a second power supply of the plurality of power supplies based on the distance signal.

9. The sensing device of claim 8, wherein:
    the first power supply has a higher power output than the second power supply; and
    the power supply controller is configured to:
        switch from the first power supply to the second power supply when the distance signal indicates that the distance is shorter than a first threshold; or switch from the second power supply to the first power supply when the distance signal indicates that the distance is longer than a second threshold.

* * * * *